United States Patent [19]

Freller et al.

[11] 4,198,449

[45] Apr. 15, 1980

[54] METHOD FOR THE PREPARATION OF THIN FILMS OF HIGH-TEMPERATURE-RESISTANT METALS SUCH AS TUNGSTEN, MOLYBDENUM, RHENIUM OR OSMIUM

[75] Inventors: Helmut Freller, Röthenbach; Günther Titze, Nüremberg, both of Fed. Rep. of Germany

[73] Assignee: Siemens Aktiengesellschaft, Munich, Fed. Rep. of Germany

[21] Appl. No.: 898,018

[22] Filed: Apr. 20, 1978

[30] Foreign Application Priority Data

May 18, 1977 [DE] Fed. Rep. of Germany ....... 2722668

[51] Int. Cl.² .................. C23C 11/00; C23C 13/00; B05D 3/00; B05D 3/02
[52] U.S. Cl. ........................... 427/255.3; 427/124; 427/252; 427/255; 427/295; 427/319; 427/320; 427/113; 427/314; 427/255.1; 427/255.2
[58] Field of Search .............. 427/124, 248 A, 248 B, 427/248 C, 252, 255, 295, 319, 320, 113, 314

[56] References Cited

U.S. PATENT DOCUMENTS 3,963,839  6/1976  Freller .................................. 427/252

FOREIGN PATENT DOCUMENTS 1328451  8/1973  United Kingdom .................... 427/124

Primary Examiner—Michael F. Esposito
Assistant Examiner—Richard Bueker
Attorney, Agent, or Firm—Kenyon & Kenyon

[57] ABSTRACT

Disclosed herein is the preparation of thin films of tungsten, molybdenum, rhenium or osmium on a high-temperature resistant substrate by thermal evaporation in a high vacuum, wherein the oxides of these high-temperature-resistant metals are evaporated simultaneously with a reduction metal in a manner such that the oxide molecules and the metal atoms or molecules impinge together on the surface of the substrate heated to a predetermined temperature and react with each other there chemically, so that the high-temperature-resistant metal oxides are reduced and the reduction metals are oxidized. In this process, the high-temperature-resistant metal is deposited on the surface of the substrate, and the oxides of the reduction metals evaporate, either completely or partially, and are pumped off.

8 Claims, No Drawings

METHOD FOR THE PREPARATION OF THIN FILMS OF HIGH-TEMPERATURE-RESISTANT METALS SUCH AS TUNGSTEN, MOLYBDENUM, RHENIUM OR OSMIUM

BACKGROUND OF THE INVENTION

The invention relates to a method for the preparation of thin films of high-temperature-resistant metals such as tungsten, molybdenum, rhenium or osmium on a heated high-temperature-resistant substrate by thermal evaporation of the oxides of the high-temperature resistant metals in a high vacuum.

Heavy metals such as tungsten, molybdenum, rhenium or osmium find application in electron and X-ray tubes and more recently also in highly integrated (LSI) circuits in solid-state electronics, because of their high melting point and their high-temperature strength. Their low tendency to weld makes it possible to utilize them in switch contacts and in addition, such metals are currently being considered and tested as protective layers for structural parts of fusion reactors.

Most of the mentioned applications, especially in X-ray anodes, integrated circuits, contacts and in casting structural parts, require for economic or functional reasons, thin films of such high-temperature-resistant metals on substrates which can be subjected to relatively high thermal stresses.

The preparation of these thin films can be accomplished by expensive and laborious methods such as fusion electrolysis, precipitation from the gaseous phase from chemical compounds or by plasma spraying. Vapor deposition of the thin films on the substrates, however, presents difficulties because of the high melting point and the low vapor pressure of metals such as tungsten, molybdenum, rhenium or osmium. Thus, while it is possible to vapor-deposit tungsten or molybdenum by means of electron beam evaporation or by cathode sputtering in a vacuum, thermal evaporation in a high vacuum, which is far more economical and easier to control insofar as the formation of layers is concerned, fails mainly because of the high evaporation temperatures.

From the German Pat. No. 2,346,394, a method for the preparation of thin films of tungsten or molybdenum on a high-temperature-resistant substrate by thermal evaporation in a high vacuum is known. This known method leads to heavy-metal layers via the evaporation of the oxides of tungsten and molybdenum and decomposition at a hot substrate.

SUMMARY OF THE INVENTION

It is an object of the present invention to improve or extend the method for the preparation of thin films of tungsten or molybdenum known from German Pat. No. 2346394, in order to obtain a higher growth rate and larger final film thickness.

According to the invention, the problem is solved by evaporating the oxides of the high-temperature-resistant metals simultaneously with a reduction metal in such a manner that the oxide molecules and the metal atoms or molecules impinge together on the surface of the substrate heated to a predetermined temperature and react there chemically with each other; by reducing the high-temperature-resistant metal oxides and oxidizing the reduction metals, whereby the high-temperature-resistant metal is precipitated on the surface of the substrate; and by arranging that the oxides of the reduction metals evaporate again, completely or partially, and are removed (i.e., pumped off).

It is advantageous to evaporate tin or aluminum as reduction metals.

Substrates which are advantageously suited for use in the present invention are graphite, vitreous coal, pyrographite, ceramics with an operating temperature above about 1000° C. or tungsten, molybdenum, rhenium, osmium or alloys of these metals as well as composite materials of $Al_2O_3$ and tungsten or $Al_2O_3$ and carbon.

In the method according to the invention, for example, highly volatile $Re_2O_7$ is evaporated at 220° C., $OsO_2$ at 600° C., $MoO_3$ at 700° C. or $WO_3$ at 1200° C. by resistance heating from a molybdenum crucible. Simultaneously, a reduction metal is evaporated from a second crucible. On the hot substrate, a reduction of the heavy-metal oxide Ax by the reduction metal B takes place between the impinging vapor particles according to $Ax + B \rightleftharpoons Bx + A$. This reaction, however, proceeds in the desired direction and speed only if the reaction temperatures are relatively high and the formation energy of the compound Bx is more negative and, therefore, larger than that of Ax. Because of the relatively low formation energy of the heavy-metal oxides mentioned, many metals theoretically can be considered for the reduction. For producing pure heavy-metal films, however, the reaction product Bx must evaporate at the reaction temperature in the high vacuum, so that it is not incorporated into the layer. In addition, A and B should not form intermetallic compounds and, if possible, should exhibit no mutual solubility. These requirements are met by tin, as numerous tests have shown.

Incorporating Bx into the film can be of advantage if the reaction product Bx makes possible an improvement of the metal film in some definite direction. Thus, it is known, for example, to increase the hardness of metals by alloying-in aluminum and subsequently oxidizing the aluminum share by a heat treatment in an oxidizing atmosphere (dispersion hardening).

With the method according to this invention, it is possible, if aluminum is used as the reduction metal, to incorporate immediately finely distributed aluminum oxide into the heavy-metal film, as $Al_2O_3$ is neither decomposed nor evaporated at the temperatures under discussion. In this manner, the hardness of the film becomes two to three times higher than that of the pure heavy-metal film.

DETAILED DESCRIPTION OF THE INVENTION

The invention will be illustrated by the following examples.

EXAMPLE 1

A graphite disc, 20 mm in diameter and 10 mm thick, is arranged in a conventional high-vacuum vapor deposition equipment about 10 cm above the evaporators. Tungsten (VI) oxide is filled into an evaporator which consists of a resistance-heated molybdenum crucible. A second, similar crucible, but with an insert of $Al_2O_3$ or vitreous carbon, is filled with tin. Subsequently, the vapor deposition equipment is evacuated to $10^{-5}$ mbar and the graphite disc is heated to about 1200° C. The two evaporators are heated to a temperature which causes a vapor pressure of about $10^{-2}$ mbar above the evaporator (i.e., about 1200° C. for $WO_3$ and 1250° C. for Sn). After the graphite disc was exposed to the vapors for 30 minutes, a metal film about 10 μm thick had grown. An analysis of the film showed only 9 ppm tin contamination, besides small amounts of $W_2C$ and WC. When $Re_2O_7$ was used instead of $WO_3$, a carbide-free Re-deposit with an Sn-contamination of $\leq 10$ ppm was obtained at evaporator temperatures of 220° C. for $Re_2O_7$ and 1250° C. for tin at a substrate temperature as low as 850° C., but preferably 1200° C. While the use of $ReO_2$ requires evaporator temperatures of 1200° C., it leads otherwise to the same results.

EXAMPLE 2

A disc of molybdenum sheet, 30 mm in diameter and 0.4 mm thick, is heated to 1000° C. and exposed at a pressure of $10^{-5}$ mbar to the simultaneously incident vapors of $WO_3$ (evaporation temperature, 1250° C.) and Al (evaporation temperature, 1150° C.). After a vapor deposition time of 5 minutes, a layer of 10 μm has grown. The layer consists of tungsten with finely distributed $Al_2O_3$. The embedment of the oxide results in an increase of the surface hardness to 11,000 N/mm² as compared to 2,000 N/mm² for uncoated sheets.

EXAMPLE 3

An $Al_2O_3$ disc, 20 mm in diameter and 1 mm thick, is arranged above the evaporators as in Examples 1 and 2 and is heated in a vacuum of $10^{-5}$ mbar to 1200° C. and is exposed to the vapor jets from an $OsO_2$ evaporator (600° C.) and an Sn evaporator (1250° C.) for 10 minutes. After this time, an osmium layer of 1 μm has grown. Similar results are obtained on graphite and tungsten substrates.

What is claimed is:

1. In a method for the preparation of thin films of high-temperature-resistant metals on a heated high-temperature-resistant substrate by thermal evaporation of the oxides of said high-temperature-resistant metals in a high vacuum, the improvement comprising simultaneously evaporating the oxide of said high-temperature-resistant metal with a reduction metal such that the molecules of said oxide and the atoms of said reduction metal impinge together and chemically react on the surface of said heated substrate to cause reduction of the metal oxide and oxidation of the reduction metal, in the process of which the high-temperature-resistant metal is precipitated on the surface of said substrate, and the resultant oxides of said reduction metal are at least partially evaporated and removed or are incorporated into said thin film.

2. The method according to claim 1 wherein said substrate is selected from the group consisting of graphite, vitreous coal and pyrographite.

3. The method according to claim 1 wherein said substrate comprises a ceramic having an operating temperature above about 1000° C.

4. The method according to claim 1 wherein said substrate is selected from the group consisting of tungsten, molybdenum, rhenium, osmium and alloys thereof.

5. The method according to claim 1 wherein the substrate is a composite of aluminum oxide with a material selected from the group consisting of tungsten and carbon.

6. The method according to claim 1 wherein said high-temperature-resistant metal is selected from the group consisting of tungsten, molybdenum, rhenium and osmium.

7. In a method for the preparation of thin films of high-temperature-resistant metals on a heated high-temperature-resistant substrate by thermal evaporation of the oxides of said high-temperature-resistant metals in a high vacuum, the improvement comprising simultaneously evaporating the oxide of said high-temperature-resistant metal with a reduction metal comprising tin such that the molecules of said oxide and the atoms of said reduction metal impinge together and chemically react on the surface of said heated substrate to cause reduction of the metal oxide and oxidation of the reduction metal, in the process of which the high-temperature-resistant metal is precipitated on the surface of said substrate, and the resultant oxides of said reduction metal are at least partially evaporated and removed or are incorporated into said thin film.

8. In a method for the preparation of thin films of high-temperature-resistant metals on a heated high-temperature-resistant substrate by thermal evaporation of the oxides of said high-temperature-resistant metals in a high vacuum, the improvement comprising simultaneously evaporating the oxide of said high-temperature-resistant metal with a reduction metal comprising aluminum such that the molecules of said oxide and the atoms of said reduction metal impinge together and chemically react on the surface of said heated substrate to cause reduction of the metal oxide and oxidation of the reduction metal, in the process of which the high-temperature-resistant metal is precipitated on the surface of said substrate, and the resultant oxides of said reduction metal are at least partially evaporated and removed or are incorporated into said thin film.

* * * * *